United States Patent [19]

Shackle et al.

[11] Patent Number: 4,528,461
[45] Date of Patent: Jul. 9, 1985

[54] INTEGRATED CIRCUIT SWITCH USING STACKED SCRS

[75] Inventors: Peter W. Shackle, Melbourne; Robert S. Pospisil, Palm Bay, both of Fla.

[73] Assignee: Harris Corporation, Melbourne, Fla.

[21] Appl. No.: 414,862

[22] Filed: Sep. 3, 1982

[51] Int. Cl.³ .............................................. H03K 17/72
[52] U.S. Cl. ........................... 307/252 L; 307/252 W; 357/49
[58] Field of Search .......... 307/252 W, 252 N, 252 L, 307/303; 363/54, 57, 27, 128, 135; 323/300, 320; 357/38, 49

[56] References Cited

U.S. PATENT DOCUMENTS

| 3,254,236 | 5/1966 | Meng | 307/252 L |
| 3,348,063 | 10/1967 | Bray | 307/252 W |
| 3,585,403 | 6/1971 | Gribbons | 307/252 L |
| 3,940,683 | 2/1976 | Blauschild . | |

Primary Examiner—John Zazworsky
Attorney, Agent, or Firm—Barnes & Thornburg

[57] ABSTRACT

An integrated circuit switch having a pair of serially connected SCRs with diodes connecting the gates of the SCRs to an independent bias source such that the second SCR is gated on first to enable the gating of the first SCR in the series connection.

14 Claims, 3 Drawing Figures

INTEGRATED CIRCUIT SWITCH USING STACKED SCRS

BACKGROUND OF THE INVENTION

The present invention relates generally to high voltage semiconductor switches and, more specifically, to an integrated high voltage capacity semiconductor switch.

With increased use of integrated circuits in high voltage environments, integrated circuits are required to have greater voltage handling capacity. Specifically, integrated circuit motor controls have been developed and, consequently, the switching circuitry must be capable of handling at one point as much as 400 volts. The ability to handle these voltages with discrete components is well-known in the prior art. There is a great need presently to develop integrated circuits which perform the function of discrete device circuits and components. It is well-known in the prior art to stack or connect in series a pair of silicon controlled rectifiers (SCR) in order to handle voltages greater than the capacity of a single SCR component. The control of these discrete SCR's is well-known and will not be discussed herein in detail. The problem lies in incorporating the stacked SCR principle into an integrated circuit.

SUMMARY OF THE INVENTION

An object of the present invention is to provide a stacked silicon controlled rectifier configuration in an integrated circuit.

Another object of the present invention is to provide a semiconductor switch which is capable of handling high voltages.

Still an even further object of the present invention is to provide a bidirectional semiconductor integrated switch.

These and other objects of the present invention are achieved by using a pair of series connected SCR's connected between two points in an integrated circuit which experience high voltages. A biasing terminal is connected to the gate of the first SCR by a first diode and connected to the gate of a second SCR by a pair of second diodes. With the required high voltage applied across the two terminals and a biasing voltage applied to the biasing terminal, the pair of diodes are forward-biased and the second SCR is gated on by biasing current. This enables the first SCR to be activated by forward-biasing the first diode such that the first SCR is gated on by the biasing potential. The stacked diodes are unidirectional and can be made to form a bidirectional switch by placing the stacked SCR's and the diodes just described in the center of a four legged diode bridge. The opposed legs of the diode bridge will conduct alternately depending upon the polarity of the input signals through the unidirectional SCR's to provide bidirectional current through the opposed terminals.

Other objects, advantages and novel features of the present invention will become evident upon review of the description of the preferred embodiments when considered in conjunction with the accompanying drawings.

DESCRIPTION OF THE PREFERRED EMBODIMENTS

Figure 1:
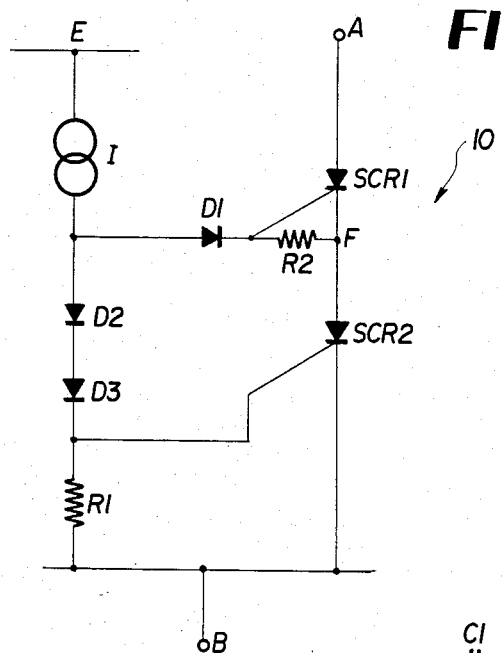
FIG. 1 is a integrated switch incorporating the principles of the present invention.

An integrated circuit switch incorporating the principles of the present invention is illustrated in FIG. 1 as 10. The switch 10 includes terminals A and B which are two points to be interconnected in an integrated circuit and across which a very high voltage appears. The other terminal of switch 10 is a biasing terminal E. The switch 10 includes a pair of serial connected silicon controlled rectifiers SCR 1 and SCR 2. The anode of SCR 1 is connected to terminal A, the cathode of SCR 1 is connected to the anode of SCR 2 and the cathode of SCR 2 is connected to terminal B. The juncture of the cathode of SCR 1 and the anode of SCR 2 is denoted by the letter F.

Connected to the biasing terminal E is a current source I. The gate of SCR 1 is connected to the current source I by diode D1 having its anode connected to the current source I and its cathode connected to the gate of SCR 1. The gate of SCR 2 is connected to current source I by a pair of serially connected diodes D2 and D3. The anode of D2 is connected to the current source I, its cathode connected to the anode of diode D3 and the cathode of D3 is connected to the gate of SCR 2. A resistor R1 connects the cathode of diode D3 to the terminal B. A resistor R2 connects the cathode of diode D1 to point F which is the juncture of the SCR 1 and SCR 2. The function of resistors R1 and R2 is to shunt the gates of the SCR's and, thus, to permit control of the gate sensitivity and transient voltage sensitivity of the SCR's.

In normal operation, the voltage appearing across terminals A and B is very high with terminal A being positive with respect to terminal B. This voltage can be greater than the individual breakdown voltages of SCR 1 and SCR 2, but should not exceed the sum of breakdown voltages. Initially, SCR 1 and SCR 2 are not conducting or on. With the biasing voltage applied to terminal E, and SCR 1 and SCR 2 not conducting, point F is at a very high potential. Consequently, D1 is reversed-biased. With the presence of a biasing voltage on E, the current source I provides a biasing current through D2, D3 and R1 to gate SCR 2 on. Once SCR 2 is gated on, the voltage on point F is brought down to substantially that of terminal B. This forward biases diode D1 which in turn gates SCR 1 on using the current from current source I. Thus, points A and B are interconnected by the activated devices SCR 1 and SCR 2. The voltage capability of the pair is greater than the single device and, thus, allows interconnection of two points of very high potential in an integrated circuit.

Figure 2:
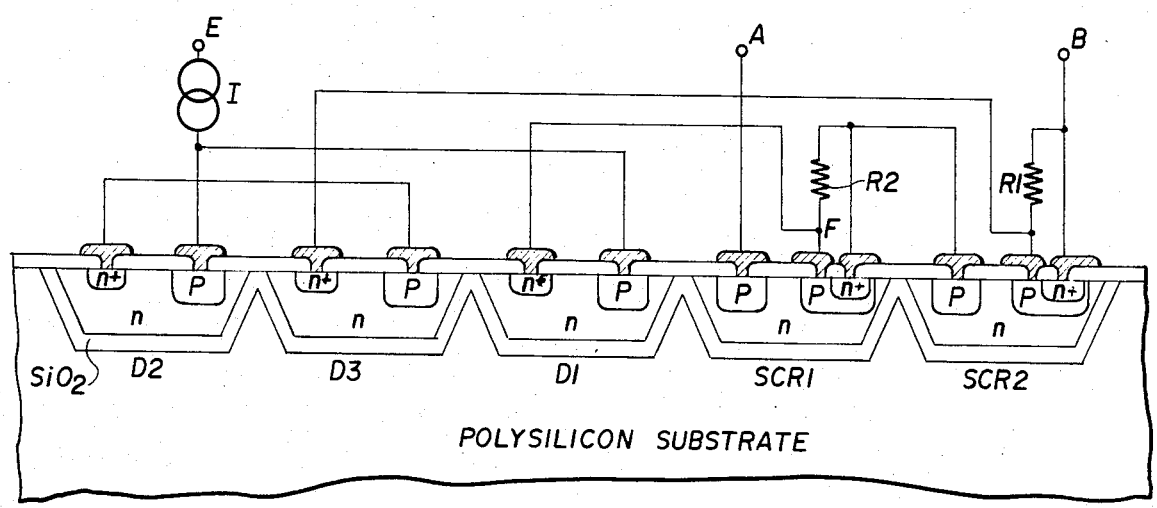
FIG. 2 is a cross-section of a substrate incorporating the integrated switch of FIG. 1.

The integration of the switch 10 of FIG. 1 into a single substrate is illustrated in FIG. 2. The SCR's SCR 1 and SCR 2 and the diodes D1, D2 and D3 are each formed in individually dielectrically isolated islands in the single substrate. The interconnections are schematically shown and may be represented by surface conductors. The resistors R1 and R2 are also schematically shown and may be formed as surface conductors or as diffused resistors. The current source I is illustrated schematically also and may be built in a dielectrically isolated island in the substrate.

The details of the construction of the integrated circuit and method of making are well-known and, thus, will not be described in detail. The purpose of FIG. 2 is to illustrate that the switch of circuit 10 can be readily formed as an integrated circuit having the voltage capacity described above. It should be noted, however, that diodes D1, D2 and D3 can be identical and formed by the same process steps. This minimizes any mismatch and simplifies the fabrication process.

Figure 3:
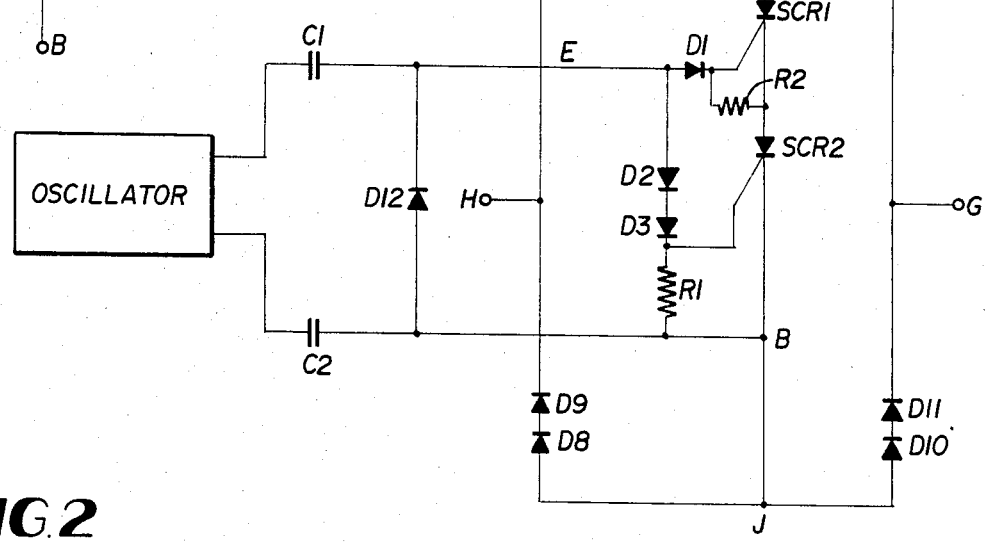
FIG. 3 is a bidirectional integrated circuit switch incorporating the principles of the present invention.

The switch 10 of FIG. 1 is a unidirectional switch and can only handle a more positive voltage at point A relative to terminal B. The adaptation of switch 10 to form a bidirectional integrated circuit switch is illustrated in FIG. 3. As in FIG. 1, the unidirectional switch 10 in FIG. 2 includes SCR 1 and SCR 2 connected between terminals A and B and diodes D1, D2, D3 connected between point E and the gates of the respective SCRs and resistor R1. The resistor R2 between the cathode of D1 and the cathode SCR 1 can be deleted to maximize gate sensitivity since R1, D2 and D3 already shunt the gate of SCR 1 and the alternate shunt path prevents SCR 1 from being indefinitely sensitive. R1 could be eliminated if desired to make SCR 2 ultra sensitive. A diode bridge is provided with opposed terminals G and H connected to the points in the circuit to which are applied high alternating current voltages. The unidirectional switch 10 of FIG. 1 is connected to the other pair of opposed terminals J and K of the bridge.

The diode bridge includes series connected diodes D4 and D5 as a first leg connected between terminals H and K, a pair of series connected diodes D6 and D7 as a second leg connected between terminals G and K, a pair of series connected diodes D8 and D9 as a third leg connected between terminals J and H and series connected diodes D10 and D11 as fourth legs connected between terminals J and G. Each leg of the bridge has two diodes so that the voltage handling capability of the diode bridge is double that which it would be with only one diode in each leg. The diodes D4 through D11 are connected such that only a pair of opposed legs of the bridge are conducting at one time. As will be evident from the description of the circuit below, even though the direction of the current through the bridge between terminals G and H is reversed, the flow of current between terminals J and K is always the same or unidirectional.

The source of biasing, in the example illustrated in FIG. 3, connected to point E is an oscillator capacitively coupled through capacitors C1 and C2 and diode D12 to the point E and to the common terminal B of the cathode of SCR 2 and a resistor R.

The operation of the bidirectional switch of FIG. 3 will now be explained. With terminal H of the bridge positive with respect to terminal G, diodes D4 and D5 and diodes D10 and D11 of the opposed leg of the bridge are forward-biased providing a conduction path between terminals H to K and J to G. The high frequency alternating current signal from the oscillator is rectified by diode D12 so that the required positive potential appears on terminal E to drive the gates of the SCRs. The SCRs are switched onto their conducting state by the application of the AC signal. The capacitors C1 and C2 allow the potential of the SCR switch circuit to be greatly different to that of the oscillator since they provide DC isolation between the two circuits. The unidirectional switch 10 operates as described for FIG. 1 with SCR 2 being gated on first followed by SCR 1 to provide a unidirectional flow between terminals K and J. Thus, the current flow through the bridge is from terminal H to terminal J to terminal G.

With the reversal of the potential at terminals H and G, the SCRs 1 and 2 are turned off. When terminal G has a higher potential than that at terminal H of the bridge, diodes D6 and D7 are forward-biased and opposed diodes D8 and D9 are forward-biased providing conduction path between terminals G and K and between terminals J and H. The unidirectional switch 10 is operated first gating on SCR 2 and then SCR 1 to provide a unidirectional flow between terminals K and J. Thus, the current flow through the bridge is from terminal G to terminal K to terminal J to terminal H. Thus, it is evident that the undirectional switch 10 of FIG. 1 by incorporating into a diode bridge is converted to a bidirectional switch having the capability to handle bidirectional high value voltages.

In one application, the terminals H and G may be connected to the gate and anode, respectively, of a triac which controls a motor or other line power load.

As is evident from the description of the preferred embodiments, the objects of the invention are attained in that an integrated circuit switch capable of handling high voltages is provided. Although the invention has been described and illustrated in detail, it is clearly understood that the same is by way of illustration and example only and is not to be taken by way of limitation. Although the stacked gated rectifiers are illustrated as silicon controlled rectifiers, it is evident that other types of gated rectifiers or thyristors such as TRIACS, GTO's and ASCR's may be used. The spirit and scope of the present invention are to be limited by the terms of the appended claims.

What is claimed is:

1. An integrated circuit switch for interconnecting a pair of points in a circuit comprising:
    a first and second terminal for connecting to said pair of points in a circuit;
    first and second thyristors having main electrodes serially connected to one another and said first thyristor having a main electrode connected to said first terminal and said second thyristor having a main electrode connected to said second terminal;
    a third terminal for receiving a biasing potential;
    a first diode means connecting said third terminal to the gate of said first thyristor for gating said first thyristor on by said biasing potential;
    a second diode means connecting said third terminal to the gate of said second thyristor for gating said second thyristor on by said biasing potential;
    when a voltage less than the sum of the breakdown voltage of both of said first and second thyristors is applied across the first and second terminals and said biasing potential is applied to said third terminal, said second thyristor is gated on via said second diode means thereby enabling said first thyristor to be gated on via said first diode means.

2. The integrated circuit switch according to claim 1, wherein said first diode means includes a PN diode having its anode connected to said third terminal and its cathode connected to said gate of said first thyristor.

3. The integrated circuit switch according to claim 2, including an impedance means connected between said gate of said first thyristor and the juncture of the main terminals of said first and second thyristors for reducing the sensitivity of said gate.

4. The integrated circuit switch according to claim 1, wherein said second diode means includes a pair of series connected PN diodes having the anode of the first PN diode of said pair connected to said third terminal and the cathode of the second diode of said pair connected to said gate of said second thyristor.

5. The integrated circuit switch according to claim 1, wherein said first and second thyristors are silicon controlled rectifiers.

6. The integrated circuit switch according to claim 1, wherein said first thyristor, said second thyristor, said first diode means and said second diode means are in separate dielectrically isolated regions of a common substrate.

7. The integrated circuit according to claim 1, including an impedance means connected between said gate of said second thyristor and said second terminal for reducing the sensitivity of said gate.

8. A bidirectional integrated circuit switch for interconnecting a pair of points of a circuit comprising:
   a diode bridge having a first pair of opposed terminals for connection to said pair of points of a circuit and having a second pair of opposed terminals;
   a unidirectional switch means connected between said second pair of opposed terminals for controlling bidirectional operation of said diode bridge using opposed pair of legs of said bridge;
   said unidirectional switch means including:
   (a) first and second thyristors having main electrodes serially connected to one another, said first thyristor having a main electrode connected to a first of said second pair of opposed points and said second thyristor having a main electrode connected to a second of said second pair of opposed points;
   (b) biasing terminal for receiving a biasing potential;
   (c) first diode means connecting said biasing terminal to the gate of said first thyristor for gating said first thyristor on by said biasing potential after said second thyristor is gated on; and
   (d) second diode means connecting said biasing terminal to the gate of said second thyristor for gating said second thyristor on by said biasing potential thereby enabling said first thyristor to be gated on via said first diode means.

9. A bidirectional integrated circuit switch according to claim 8, wherein each leg of said diode bridge includes a pair of series connected diodes.

10. A bidirectional integrated circuit switch according to claim 8, wherein said first diode means includes a single diode, and said second diode means includes a pair of series connected diodes.

11. A bidirectional integrated circuit switch according to claim 8, wherein said first and second thyristors are silicon controlled rectifiers.

12. A bidirectional integrated circuit switch according to claim 8, wherein said first thyristor, said second thyristor, said first diode means and said second diode means are in separate dielectrically isolated regions of a common substrate.

13. A bidirectional integrated circuit switch according to claim 8, including a first impedance means connected to the gate of said first thyristor and second impedance means connected to said gate of said second thyristor for reducing the sensitivity of said gates.

14. An integrated circuit switch for interconnecting a pair of points in a circuit comprising:
   first and second terminals for connecting to said pair of points in a circuit;
   first and second thyristors having main electrodes connected serially to one another, said first thyristor having a main electrode connected to said first terminal and said second thyristor having a main electrode connected to said second terminal;
   a third terminal for receiving a biasing potential;
   an oscillator means for providing an alternating signal;
   rectifying means for converting said alternating signal from said oscillator means to a direct current biasing potential and providing same to said third terminal;
   capacitive means for capacitively coupling said oscillator means to said rectifying means;
   a first diode means connecting said third terminal to the gate of said first thyristor for gating said first thyristor on by said biasing potential;
   a second diode means connecting said third terminal to the gate of said second thyristor for gating said second thyristor on by said biasing potential; and
   when a voltage less than the sum of the breakdown voltage of said first and second thyristors is applied across said first and second terminals and biasing potential is applied to said third terminal, said second thyristor is gated on via said second diode means thereby enabling said first thyristor to be gated on via said first diode means.

* * * * *